(12) United States Patent
Chiang et al.

(10) Patent No.: US 7,829,928 B2
(45) Date of Patent: Nov. 9, 2010

(54) SEMICONDUCTOR STRUCTURE OF A HIGH SIDE DRIVER AND METHOD FOR MANUFACTURING THE SAME

(75) Inventors: Chiu-Chih Chiang, Hsinchu (TW); Chih-Feng Huang, Jhubei (TW)

(73) Assignee: System General Corp., Taipei (TW)

( * ) Notice: Subject to any disclaimer, the term of this patent is extended or adjusted under 35 U.S.C. 154(b) by 1056 days.

(21) Appl. No.: 11/474,375

(22) Filed: Jun. 26, 2006

(65) Prior Publication Data

US 2007/0296058 A1    Dec. 27, 2007

(51) Int. Cl.
    *H01L 21/00* (2006.01)
(52) U.S. Cl. .................. 257/299; 257/328; 257/335; 257/343; 257/532; 257/E21.397; 257/E27.016; 257/E27.048; 257/E29.012; 257/E29.027; 257/E29.256
(58) Field of Classification Search ......... 257/299–343, 257/532, E21.397, E27.016, 48, E29.012, 257/27, 256
See application file for complete search history.

(56) References Cited

U.S. PATENT DOCUMENTS

| | | | |
|---|---|---|---|
| 4,527,180 A * | 7/1985 | Oto ........................... 257/532 |
| 5,258,636 A | 11/1993 | Rumennik et al. |
| 5,289,025 A * | 2/1994 | Lee ............................ 257/299 |
| 5,536,672 A * | 7/1996 | Miller et al. ................... 438/3 |
| 5,736,774 A | 4/1998 | Fujihira |
| 5,801,418 A | 9/1998 | Ranjan |
| 5,925,905 A * | 7/1999 | Hanneberg et al. .......... 257/299 |
| 6,124,628 A | 9/2000 | Fujihira et al. |
| 6,262,469 B1 * | 7/2001 | Le et al. ...................... 257/532 |
| 6,323,539 B1 | 11/2001 | Fujihira et al. |
| 6,707,101 B2 * | 3/2004 | Ranjan ........................ 257/339 |
| 7,042,701 B2 * | 5/2006 | Diorio et al. ............. 361/301.4 |
| 7,309,894 B2 * | 12/2007 | Jeon et al. .................... 257/328 |
| 2002/0017683 A1 | 2/2002 | Jeon |

* cited by examiner

*Primary Examiner*—Michael S Lebentritt
(74) *Attorney, Agent, or Firm*—Bacon & Thomas, PLLC

(57) ABSTRACT

A semiconductor structure of a high side driver and method for manufacturing the same is disclosed. The semiconductor of a high side driver includes an ion-doped junction and an isolation layer formed on the ion-doped junction. The ion-doped junction has a number of ion-doped deep wells, and the ion-doped deep wells are separated but partially linked with each other.

17 Claims, 5 Drawing Sheets

SEMICONDUCTOR STRUCTURE OF A HIGH SIDE DRIVER AND METHOD FOR MANUFACTURING THE SAME

BACKGROUND OF THE INVENTION

1. Field of the Invention

The invention relates in general to a semiconductor structure, and more particularly to a semiconductor structure of a high side driver and method for manufacturing the same.

2. Description of the Related Art

FIG. 1 is a partial cross-sectional diagram of a semiconductor structure of a high side driver in a conventional power supply IC. Referring to FIG. 1, the semiconductor structure of a high side driver includes a high voltage (HV) junction 110 formed in a P-substrate 100 and a high voltage (HV) capacitor structure 120 formed on the P-substrate 100. The HV junction includes a deep N well (NWD) 112 and a number of P-wells (PW) 114. The HV capacitor structure 120 includes a first metal layer 122 and two separated second metal layers 124 and 126. The second metal layer 124 is connected to a low voltage, such as 0V, and the second metal layer 126 is connected to a high voltage +V, such as 500V. A heavy ion-doped N+ well 116 is formed between the P wells 114 for connecting to the second metal layer 126 via a bonding metal 130.

Basically, an over-large conductive material covered on the HV junction 110 will reduce the breakdown voltage of the HV junction 110. In order to prevent the breakdown voltage of the HV junction 110 being reduced by conductors (metals) in the HV capacitor structure 120, conventionally, the HV capacitor structure 120 is disposed in a region of the P-substrate 100 separated from that region forming the HV junction 110 as shown in FIG. 1, and is connected to the HV junction 110 via the bonding metal 130. However, the conventional semiconductor structure of a high side driver has the following disadvantages:

1. It needs more chip space to dispose the HV junction 110 and HV capacitor structure 120 in separated regions of the P-substrate 100.

2. It needs an extra bonding metal 130 for connecting the HV junction 110 and HV capacitor structure 120, and thus more cost for manufacturing the power supply IC.

3. The dielectric layer between the first metal layer 122 and the second metal layers 124 and 126 needs to have a thickness of at least 1.5 um so that the capacitor structure 120 can endure the high voltage 500V. However, too large thickness of the dielectric layer will result some issues, such as yield reduction of the power supply IC.

SUMMARY OF THE INVENTION

It is therefore an object of the invention to provide a semiconductor structure of a high side driver, which integrates a HV junction with a HV capacitor structure, and method for manufacturing the same. The breakdown voltage of the HV junction can be increased by forming a number of partially separated deep N wells in the HV junction. Therefore, the HV capacitor structure can be integrated with the HV junction without affecting the breakdown voltage of the HV junction, thereby reducing the chip area and cost for manufacturing the power supply IC.

The invention achieves the above-identified object by providing a semiconductor structure of a high side driver including an ion-doped junction and an isolation layer. The ion-doped junction has a number of ion-doped deep wells, and the ion-doped deep wells are separated but partially linked with each other. The isolation layer is formed on the ion-doped junction.

The invention achieves the above-identified object by providing a method for manufacturing a semiconductor structure of a high side driver. The method includes forming an ion-doped substrate; forming a number of ion-doped deep wells in the substrate, wherein the ion-doped deep wells have a complementary ion-doped type to the ion-doped substrate and the ion-doped deep wells are separated but partially linked with each other; and forming an isolation layer on the ion-doped substrate having the ion-doped deep wells.

Other objects, features, and advantages of the invention will become apparent from the following detailed description of the preferred but non-limiting embodiments. The following description is made with reference to the accompanying drawings.

DETAILED DESCRIPTION OF THE INVENTION

Figure 1:
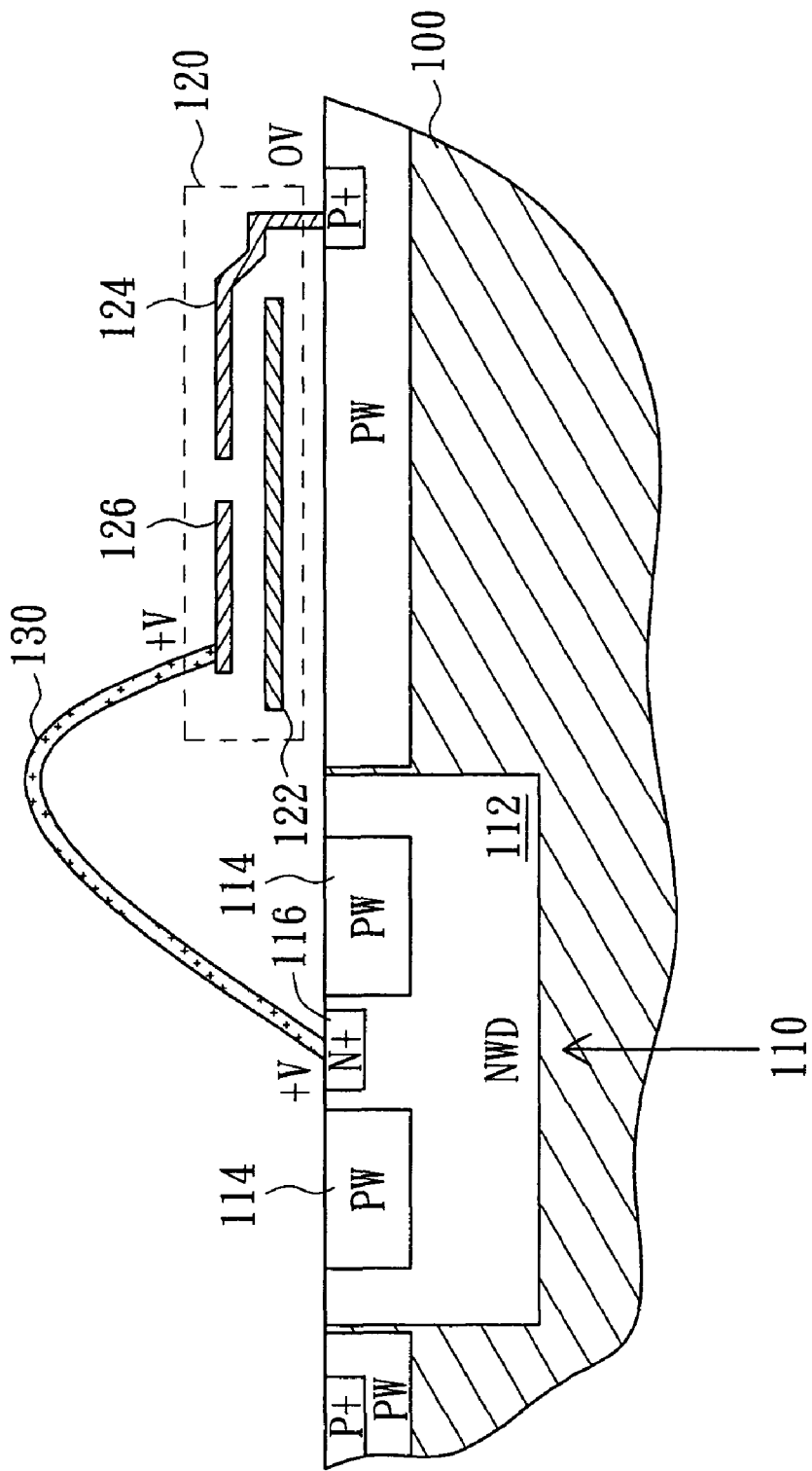
FIG. 1 is a partial cross-sectional diagram of a semiconductor structure of a high side driver in a conventional power supply IC.
Figure 2:
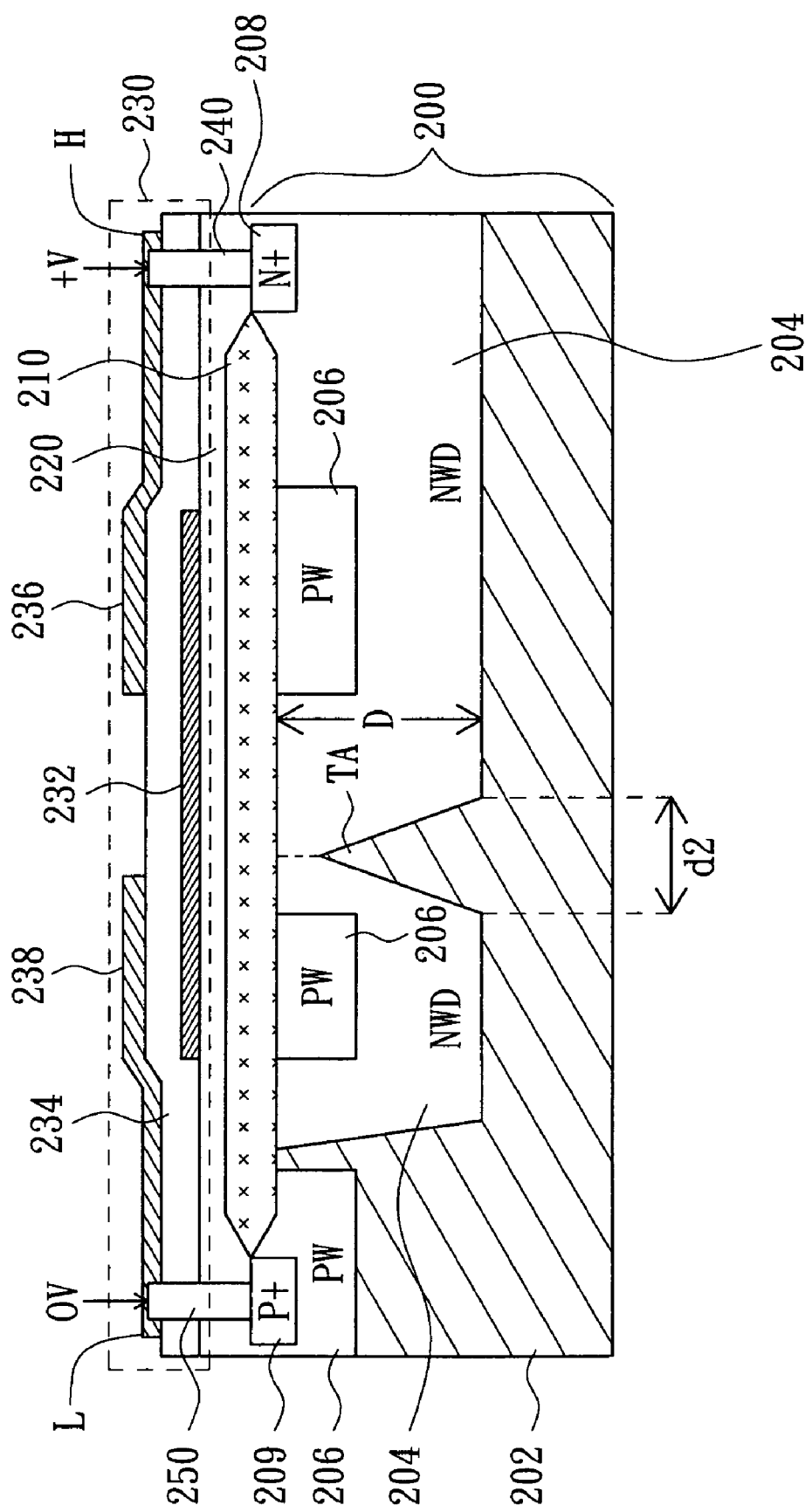
FIG. 2 is a partial cross-sectional diagram of a semiconductor of a high side driver in a power supply IC according to a preferred embodiment of the invention.

Referring to FIG. 2, a partial cross-sectional diagram of a semiconductor of a high side driver in a power supply IC according to a preferred embodiment of the invention is shown. The semiconductor structure of a high side driver includes an ion-doped junction (HV junction) 200, an isolation layer 210, a first dielectric layer 220 and a conductive capacitor structure 230. The isolation layer 210, such as an oxide layer, is formed on the ion-doped junction 200, the first dielectric layer 220 is formed on the isolation layer 210, and the conductive capacitor structure 230 is formed on the first dielectric layer 220.

The ion-doped junction 200 includes an ion-doped substrate 202 and a number of ion-doped deep wells 204 formed in the substrate 202, which are separated but partially linked with each other at an area near the isolation layer 210. For example, the ion-doped junction 200 is p-n junction, the ion-doped substrate 202 is a P-substrate and the ion-doped deep wells 204 are deep N wells (NWD) formed in the P-substrate. It can be seen from FIG. 2 that the ion-doped deep wells 204 do not connect to each other completely and an approximately-triangular area TA of the substrate 202 is formed at the region between the ion-doped deep wells 204. By forming the partially-linked ion-doped deep wells 204, the breakdown voltage of the ion-doped junction 200 can be adjusted by tuning the distance d2 between the ion-doped deep wells 204. The doping concentration of the ion-doped deep well 204 is preferably from $1.7E17$ $cm^{-3}$ to $8.3E18$ $cm^{-3}$, and the depth D of the ion-doped deep well 204 is preferably from 2 um to 10 um.

Besides, the ion-doped junction 200 further includes at least an ion-doped well 206, such as a P-well or P-body, in each of the ion-doped deep wells 204. These ion-doped wells 206 are used to increase the breakdown voltage of the ion-doped junction 200, and the breakdown voltage of the ion-doped junction 200 is determined by the shape and relative position of the ion-doped well 206 in the ion-doped deep well 204. The doping concentration of the ion-doped well 106 is preferably from $3.3E17$ $cm^{-3}$ to $1E19$ $cm^{-3}$. The ion-doped junction 200 further includes a heavy ion-doped region 208, such as an N+ region, connected to a highest potential node H of the conductive capacitor structure 230 through a via 240 and a heavy ion-doped region 209, such as a P+ region, connected to a lowest potential node L of the conductive capacitor structure 230 through a via 250. The depth D of the ion-doped deep wells 204 should be adjustable in a direct proportion according to a high voltage +V (500V~700V) applied to the conductive capacitor structure 230 so as to maintain an enough breakdown voltage of the ion-doped junction 200.

Furthermore, the conductive capacitor structure 230 includes a first metal layer 232, a second dielectric layer 234 and two second metal layers 236 and 238. The first metal layer 232 is formed on the first dielectric layer 220. The second dielectric layer 234 is formed on the first metal layer 232. The second metal layers 236 and 238 are separated and formed on the second dielectric layer 234. The second metal layer 236 and the first metal layer 232 form a first capacitor. The second metal layer 238 and the first metal layer 232 form a second capacitor, which is connected to the first capacitor in series. The second metal layer 236 is connected to the high voltage +V and the second metal layer 238 is connected to a low voltage, such as 0V. The breakdown voltage of the ion-doped junction 200 is also determined by the position of the first metal layer 232 relative to the ion-doped junction 200 or the thickness of the first dielectric layer 220.

Figure 3:
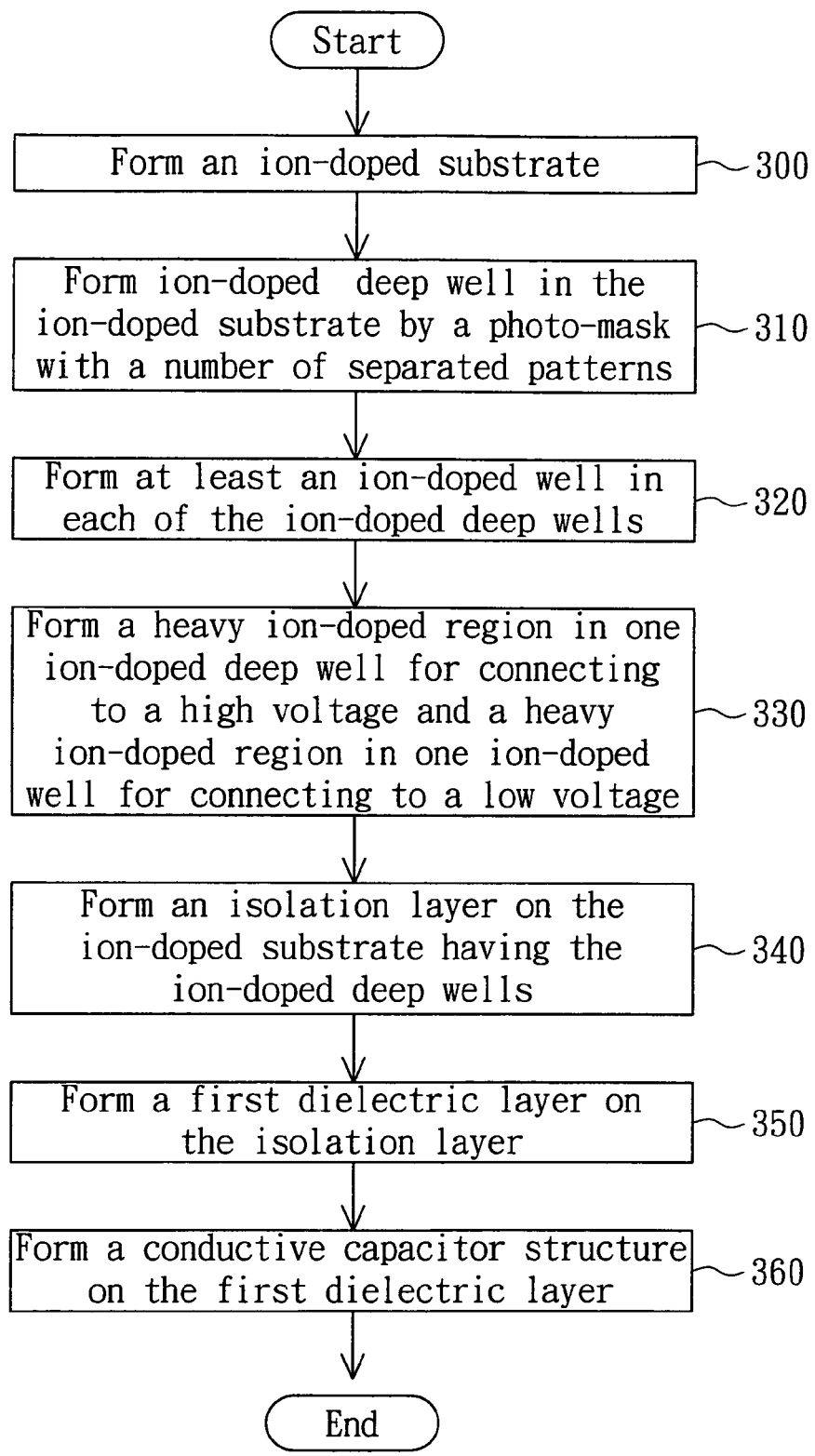
FIG. 3 is a flow chart of a method for manufacturing the semiconductor structure of a high side driver in FIG. 2.
Figure 4:
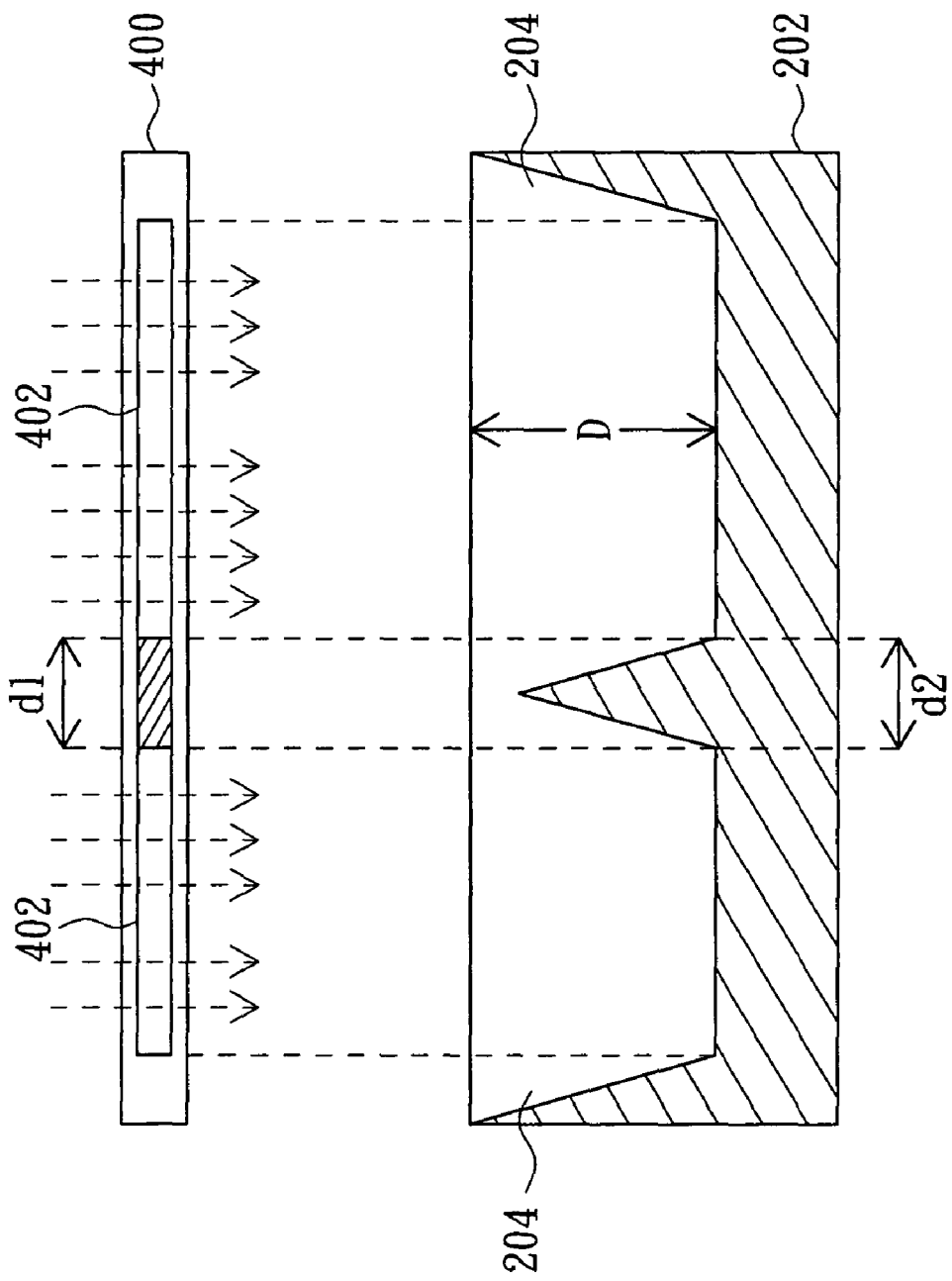
FIG. 4 is a schematic diagram of an ion doping process for forming the partially linked ion-doped deep wells in FIG. 2 by using a photo-mask with separated patterns.

FIG. 3 is a flow chart of a method for manufacturing the semiconductor structure of a high side driver in FIG. 2. Referring to FIG. 2 and FIG. 3 simultaneously, first, in step 300, form the ion-doped substrate 202, such as a P-substrate. Next, in step 310, form the ion-doped deep wells 204, such as deep N wells, in the ion-doped substrate 202 by a photo-mask 400 with a number of separated patterns 402 as shown in FIG. 4 in a thermal drive-in process during a temperature from 1000° C. to 1200° C. for 6~12 hours. Owing to that the patterns 402 of the photo-mask 400 are separated by a predetermined distance d1, the ion-doped deep wells 204 formed in the ion doping process are separated but partially linked with each other at an area near the upper surface of the ion-doped substrate 202. The distance d1 of the separated patterns 402 is proportional to the distance d2 between the ion-doped deep wells 204. The doping concentration of the ion-doped deep well 204 is preferably from $1.7E17$ $cm^{-3}$ to $8.3E18$ $cm^{-3}$, and the depth D of the ion-doped deep well 204 is preferably from 2 um to 10 um.

The main feature of the embodiment lies in the partially separated ion-doped deep wells 204 help to increase the breakdown voltage of the ion-doped substrate 202 and ion-doped deep wells 204 and thus the capacitor structure formed on the ion-doped substrate 202 in the subsequent process will not affect or worsen the breakdown voltage of the ion-doped substrate 202 and ion-doped deep wells 204.

Following that, in step 320, form at least an ion-doped well 206, such as a P-well or a P-body, in each of the ion-doped deep wells 204 in a thermal drive-in process during a temperature 900° C. to 1100° C. for 2~6 hours. The ion-doped wells 206 help to increase the breakdown voltage of the ion-doped substrate 202 and ion-doped deep wells 204, and the doping concentration of the ion-doped well 206 is preferably from $3.3E17$ $cm^{-3}$ to $1E19$ $cm^{-3}$.

Afterward, in step 330, form the heavy ion-doped region 208, such as a N+ region, in one ion-doped deep well 204 for connecting to the high voltage +V and the highest potential node H of the conductive capacitor structure 230, and the heavy ion-doped region 209, such as a P+ region, in one ion-doped well 206 for connecting to the low voltage 0V and the lowest potential node L of the conductive capacitor structure 230.

Then, in step 340, form the isolation layer 210, such as an oxide layer, on the ion-doped substrate 202 having the ion-doped deep wells 204 (i.e. the ion-doped junction 200), and in step 350, form the first dielectric layer 220 on the isolation layer 210. Finally, in step 360, form the first metal layer 232 on the first dielectric layer 220, the second dielectric layer 234 on the first metal layer 232 and the two separated second metal layers 236 and 238 on the second dielectric layer 234 to generate the conductive capacitor structure 230. The highest potential node H and the lowest potential node L of the conductive capacitor structure 230 are respectively connected to the heavy ion-doped region 208 and 209 through contacts 240 and 250.

As mentioned above, the breakdown voltage of the conductive capacitor structure 230 is also affected by the ion-doped junction 200. Due to design of the partially separated ion-doped deep wells 204, the conductive capacitor structure 230 placed on the ion-doped junction 200 can endure the high voltage 500V by using the second dielectric layer 234 with a thickness only 0.75 um.

Figure 5:
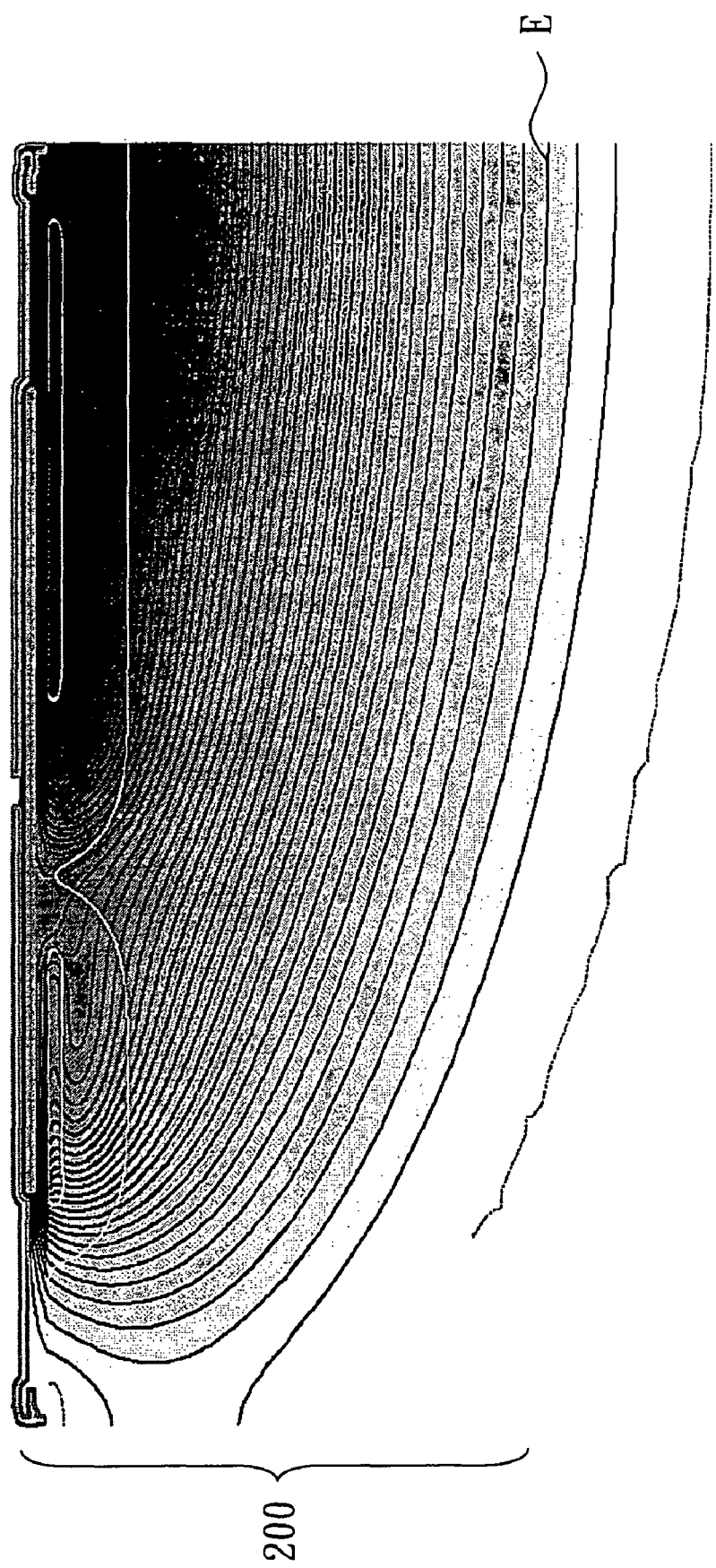
FIG. 5 is a simulation potential profile of the semiconductor structure of a high side driver according to the preferred embodiment of the invention.

Referring to FIG. 5, a simulation potential profile of the semiconductor structure of a high side driver according to the preferred embodiment of the invention is shown. From FIG. 5, it can be clearly seen that the electric field E inside the ion-doped junction 200 is very uniform, which demonstrates that a good performance of the high side driver can still be achieved by using the ion-doped junction 200 with the partially separated ion-doped deep wells (not shown in the figure).

The semiconductor structure of a high side driver and method for manufacturing the same disclosed by the above-mentioned embodiment have the following advantages:

1. The chip area for disposing the semiconductor structure of a high side driver can be reduced by integrating the conductive capacitor structure with the HV junction.

2. The prior-art bonding metal for connecting the capacitor structure and HV junction is not necessary in the invention since the capacitor structure can be integrated with the HV junction, thereby largely reducing cost for manufacturing the power supply IC.

3. The breakdown voltage of the HV junction will not be affected by the integrated capacitor structure and a good performance of the power supply IC can be achieved.

4. The dielectric layer between the split metals of the capacitor structure only needs to have a thickness 0.75 um in order that the capacitor structure can endure a 500V high voltage.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor structure of a high side driver, comprising:
   an ion-doped junction, having an ion-doped substrate and a plurality of ion-doped deep wells formed in the ion-doped substrate, wherein the ion-doped deep wells are separated but have partial and physical connection with each other at a region within the ion-dope substrate; and
   an isolation layer, formed on the ion-doped junction.

2. The semiconductor structure according to claim 1, further comprising a conductive capacitor structure formed on the isolation layer.

3. The semiconductor structure according to claim 2, wherein the ion-doped substrate is a P-substrate and the ion-doped deep wells are N-wells formed in the P-substrate.

4. The semiconductor structure according to claim 2, wherein the breakdown voltage of the ion-doped junction is determined by the distance between the ion-doped deep wells.

5. The semiconductor structure according to claim 2, wherein the ion-doped junction further comprises at least an ion-doped well in each of the ion-doped deep wells and the ion-doped well has a complementary ion-doped type to the ion-doped deep well.

6. The semiconductor structure according to claim 5, wherein the breakdown voltage of the ion-doped junction is determined by the shape and relative position of the ion-doped well in the ion-doped deep well.

7. The semiconductor structure according to claim 5, wherein the doping concentration of the ion-doped well is from 3.3E17 cm-3 to 1E19 cm-3.

8. The semiconductor structure according to claim 2, wherein the ion-doped junction further comprises a heavy ion-doped region having the same ion-doped type with the ion-doped deep wells, and the heavy ion-doped region is connected to a highest potential node of the conductive capacitor structure.

9. The semiconductor structure according to claim 2, wherein the depth of the ion-doped deep wells is directly proportional to a high voltage applied to the conductive capacitor structure.

10. The semiconductor structure according to claim 9, wherein the depth of the ion-doped deep well is from 2 um to 10 um.

11. The semiconductor structure according to claim 2, wherein the isolation layer is an oxide layer.

12. The semiconductor structure according to claim 2, further comprising a first dielectric layer formed between the conductive capacitor structure and the isolation layer.

13. The semiconductor structure according to claim 12, wherein the conductive capacitor structure comprising:
    a first metal layer, formed on the first dielectric layer;
    a second dielectric layer, formed on the first metal layer; and
    a plurality of separated second metal layers, formed on the second dielectric layer, wherein one of the second metal layers is connected to a high voltage and another one of the second metal layers is connected to a low voltage.

14. The semiconductor structure according to claim 13, wherein the breakdown voltage of the ion-doped junction is determined by the position of the first metal layer relative to the ion-doped junction.

15. The semiconductor structure according to claim 2, wherein the doping concentration of the ion-doped deep well is from 1.7E17 cm-3 to 8.3E18 cm-3.

16. The semiconductor structure according to claim 2, wherein the ion-doped deep wells are partially linked to each other at an area near the isolation layer.

17. The semiconductor structure according to claim 2, is applied to a power supply IC.

* * * * *